United States Patent
Correll et al.

(10) Patent No.: US 10,796,240 B2
(45) Date of Patent: Oct. 6, 2020

(54) PERFORMING FAULT TREE ANALYSIS ON QUANTUM COMPUTERS

(71) Applicant: QC Ware Corp., Moffett Field, CA (US)

(72) Inventors: Randall R. Correll, Mountain View, CA (US); Asier Ozaeta Rodriguez, Merced, CA (US); Alejandro Perdomo Ortiz, Berkeley, CA (US)

(73) Assignee: QC Ware Corp., Palo Alto, CA (US)

( * ) Notice: Subject to any disclaimer, the term of this patent is extended or adjusted under 35 U.S.C. 154(b) by 182 days.

(21) Appl. No.: 16/041,699

(22) Filed: Jul. 20, 2018

(65) Prior Publication Data

US 2019/0026645 A1    Jan. 24, 2019

Related U.S. Application Data

(60) Provisional application No. 62/535,855, filed on Jul. 22, 2017.

(51) Int. Cl.
| | |
|---|---|
| *G06F 11/00* | (2006.01) |
| *G06N 10/00* | (2019.01) |
| *G06F 8/52* | (2018.01) |
| *G06F 11/07* | (2006.01) |
| *G06N 5/00* | (2006.01) |
| *G05B 23/02* | (2006.01) |

(52) U.S. Cl.
CPC .......... *G06N 10/00* (2019.01); *G05B 23/0278* (2013.01); *G06F 8/52* (2013.01); *G06F 11/079* (2013.01); *G06N 5/003* (2013.01); *G05B 23/0248* (2013.01)

(58) Field of Classification Search
CPC .......... G06F 11/079; G06F 8/52; G06N 10/00
See application file for complete search history.

(56) References Cited

U.S. PATENT DOCUMENTS

| | | | |
|---|---|---|---|
| 6,671,681 B1 | 12/2003 | Emens et al. | |
| 7,774,293 B2 * | 8/2010 | Mosleh | ................... G06N 7/005 706/53 |
| 8,150,785 B2 * | 4/2012 | Baughman | ............. G06Q 10/04 706/45 |
| 9,537,953 B1 | 1/2017 | Dadashikelayeh et al. | |

(Continued)

FOREIGN PATENT DOCUMENTS

WO    WO 2016/089711 A1    6/2016

OTHER PUBLICATIONS

Fadaei, S. "Mechanism Design via Dantzig-Wolfe Decomposition," arXiv preprint, 2015, arXiv:1508.04250.

(Continued)

*Primary Examiner* — Jonathan D Gibson
(74) *Attorney, Agent, or Firm* — Fenwick & West LLP

(57) ABSTRACT

Fault tree analysis is performed using a combination of digital computer systems and quantum processing devices. For example, quantum annealers may be configured to analyze a fault tree for minimal cut sets. The quantum annealer may be particular good at identifying smaller minimal cut sets. Digital computer systems may be used to identify the remaining minimal cut sets. If the quantum annealer identifies one of the minimal cut sets of smallest size (i.e., lowest cardinality), this can be used as a constraint for the digital computer system, thus speeding up its search for other minimal cut sets.

18 Claims, 3 Drawing Sheets

(56) References Cited

U.S. PATENT DOCUMENTS

| | | |
|---|---|---|
| 2002/0188578 A1 | 12/2002 | Amin et al. |
| 2003/0105805 A1 | 6/2003 | Jorgenson |
| 2007/0011113 A1* | 1/2007 | Mosleh .................. G06N 7/005 706/14 |
| 2007/0052705 A1* | 3/2007 | Oliveira .................. G06F 30/18 345/423 |
| 2008/0116449 A1 | 5/2008 | Macready et al. |
| 2010/0083240 A1* | 4/2010 | Siman ..................... G06F 8/433 717/144 |
| 2011/0022820 A1 | 1/2011 | Bunyk et al. |
| 2013/0166135 A1* | 6/2013 | Dunsdon .................. B64F 5/40 701/29.3 |
| 2013/0166353 A1 | 6/2013 | Mihic et al. |
| 2013/0332775 A1* | 12/2013 | Xiang .................. G06F 11/079 714/37 |
| 2014/0201126 A1 | 7/2014 | Zadeh et al. |
| 2014/0237457 A1 | 8/2014 | Munshi et al. |
| 2014/0275807 A1 | 9/2014 | Redei |
| 2014/0372805 A1* | 12/2014 | Rijnders ............. G06F 11/0793 714/37 |
| 2015/0006443 A1 | 1/2015 | Rose et al. |
| 2015/0046681 A1 | 2/2015 | King |
| 2015/0106413 A1 | 4/2015 | Ronagh |
| 2016/0011996 A1 | 1/2016 | Asaad et al. |
| 2016/0224515 A1 | 8/2016 | Ronagh et al. |
| 2017/0223094 A1 | 8/2017 | Johnson et al. |
| 2017/0255872 A1 | 9/2017 | Hamze et al. |

OTHER PUBLICATIONS

Gunnerud et al., "Dantzig-Wolfe Decomposition for Real-Time Optimization—Applied to the Troll West Oil Rim," IFAC Proceedings, 2009, pp. 69-75, vol. 42, Issue 11, May be Retrieved at <URL:http://pdfs.semanticscholar. org/d8d0/ d74939b16ab798525ae0772d6f1186556542.pdf>.

PCT International Search Report and Written Opinion, PCT Application No. PCT/US2015/020033, dated May 7, 2018, 18 pages.

PCT International Search Report and Written Opinion, PCT Application No. PCT/US17/15488, dated Apr. 20, 2017, 12 pages.

United States Office Action, U.S. Appl. No. 15/415,865, dated Feb. 15, 2019, 32 pages.

Wang, B. "Sparse coding on D-Wave hardware," NextBigFuture, Apr. 29, 2013, 8 pages, Retrieved from the internet <URL: https:// www.nextbigfuture.com/2013/04/sparse-coding-on-ct-wave-hardware. html>.

* cited by examiner

PERFORMING FAULT TREE ANALYSIS ON QUANTUM COMPUTERS

CROSS-REFERENCE TO RELATED APPLICATION(S)

This application claims priority under 35 U.S.C. § 119(e) to U.S. Provisional Patent Application Ser. No. 62/535,855, "Performing Fault Tree Analysis on Quantum Annealers," filed Jul. 22, 2017. The subject matter of all of the foregoing is incorporated herein by reference in their entirety.

BACKGROUND

1. Technical Field

This disclosure relates generally to fault tree analysis.

2. Description of Related Art

In aerospace, nuclear power, chemical, pharmaceutical, petrochemical and other domains, significant computing resources are applied to system design, testing, and verification, especially related to safety compliance and regulations. Of particular interest is fault tree analysis—determining the most probable sets of failure events in a complicated system that lead to a top-level failure. Classically, when performing fault tree analysis, unless some initial search parameter or heuristic is implemented, one must evaluate individual gates within a branch of the fault tree, store these intermediate results, progress upwards through the tree and evaluate individual gates within different branches, and then compare the previous calculations with the current ones to build up a list of values that satisfy each branch of the fault tree. The amount of computational resources consumed grows quickly, particularly in memory required to store all of the intermediate results used for future comparisons as the search expands through the branches. A complete, exhaustive list of all minimal cut sets—i.e. minimal sets of events that can potentially lead to failure—is often a requisite for safety analysis. For fault trees of increasing complexity, such an exhaustive search is time-consuming when no additional information to parameterize a search heuristic is known.

Thus, there is a need for better approaches to fault tree analysis.

SUMMARY

The present disclosure overcomes the limitations of the prior art by performing fault tree analysis using a combination of digital computer systems and quantum processing devices. For example, quantum annealers may be configured to analyze a fault tree for minimal cut sets. The quantum annealer may be particular good at identifying smaller minimal cut sets. Digital computer systems may be used to identify the remaining minimal cut sets. If the quantum annealer determines the smallest size (i.e., lowest cardinality) of all the minimal cut sets, this information can be used as a constraint for the digital computer system, thus speeding up its search for other minimal cut sets. In this approach, quantum annealing is used to first probe the fault tree to determine the lower bound of the shortest minimal cut sets and then uses this information to tune the classical solver to finish completing the minimal cut sets in the cardinality range of interest.

Other aspects include components, devices, systems, improvements, methods, processes, applications, computer readable mediums, and other technologies related to any of the above.

BRIEF DESCRIPTION OF THE DRAWINGS

Embodiments of the disclosure have other advantages and features which will be more readily apparent from the following detailed description and the appended claims, when taken in conjunction with the examples in the accompanying drawings, in which:

DETAILED DESCRIPTION OF THE PREFERRED EMBODIMENTS

The figures and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Figure 1:
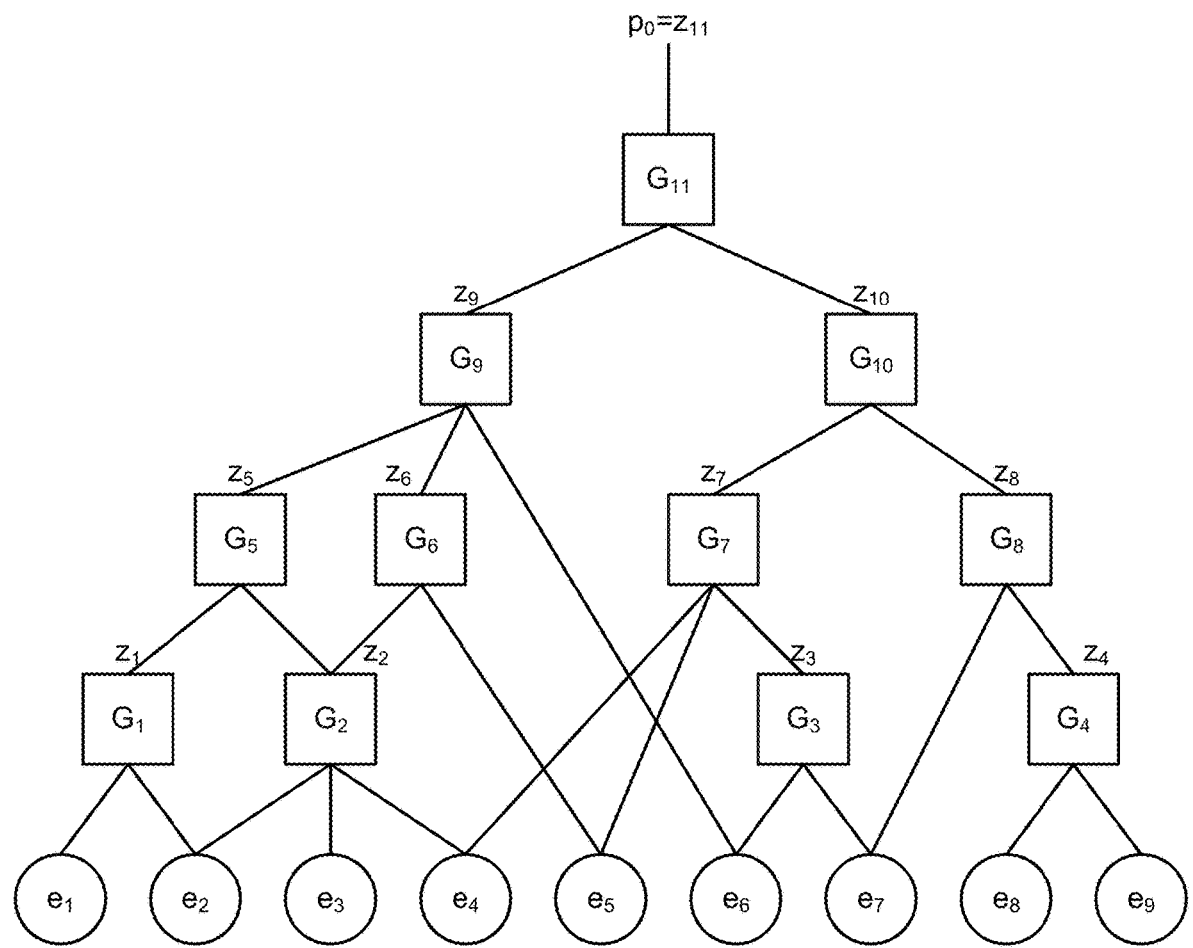
FIG. 1 (prior art) is a diagram of a fault tree.

FIG. 1 (prior art) is a diagram of a fault tree. Different fault trees are created according to the specific engineering design or other situation analyzed. The fault tree includes primary events $e_i$, gates $G_j$ that perform logic operations on events and the corresponding outputs $z_j$ of each gate, where the final output of the entire fault tree is the "top event" $p_0$ (also output $z_{11}$ in this example). The gate outputs $z_j$ (other than the final output) may also be referred to as intermediate events. For convenience, the inputs to gate (j) will be referred to as $\{x_j\}$, so that $z_j = G_j(\{x_j\})$. The inputs $\{x_j\}$ may be either primary events $e_i$ or outputs $z_j$ of other gates. The events are typically binary variables, for example $e_1=1$ means that event $e_1$ has occurred and $e_1=0$ means that event $e_1$ has not occurred.

The fault tree describes different combinations of primary events that may lead to the top event (or failure). Examples of primary events may include basic events (e.g., the failure or error in a system component or element), external events (e.g., normally occurring events which themselves are not considered failures) and conditioning events (e.g., events that restrict or affect gates). The gates $G_j$ perform logic operations. Examples of logic operations include BUFFER, NOT, AND, OR, NAND, NOR, XOR, XNOR, inhibit gate (i.e., output is also controlled by a conditioning event), and other more complex logic operations.

One type of fault tree analysis is to identify different combinations of events that will result in the top event. These combinations are referred to as cut sets. If the top event is a failure, then a cut set is a set of events that would result in that failure. A minimal cut set is a cut set where none of its subsets are also cut sets. That is, if less than all the events in the minimal cut set occur, then the top event will not occur. The cardinality of a cut set is the number of events in the cut set.

For example, let $p_0 = e_1$ AND $(e_2$ OR $e_3)$. Then $\{e_1, e_2, e_3\}$ is a cut set, but it is not a minimal cut set because subset $\{e_1, e_2\}$ is also a cut set. $\{e_1, e_2\}$ is a minimal cut set, because neither of the subsets $\{e_1\}$ or $\{e_2\}$ is a cut set. The exhaustive list of minimal cut sets for this fault tree is $\{e_1, e_2\}$ $\{e_1, e_3\}$. These two minimal cut sets have a cardinality of 2, which is also the lowest cardinality of any minimal cut set for this fault tree. These are the shortest minimal cut sets.

Note that there may be more than one minimal cut set with this lowest cardinality. There may also be minimal cut sets with higher cardinality.

Figure 2:
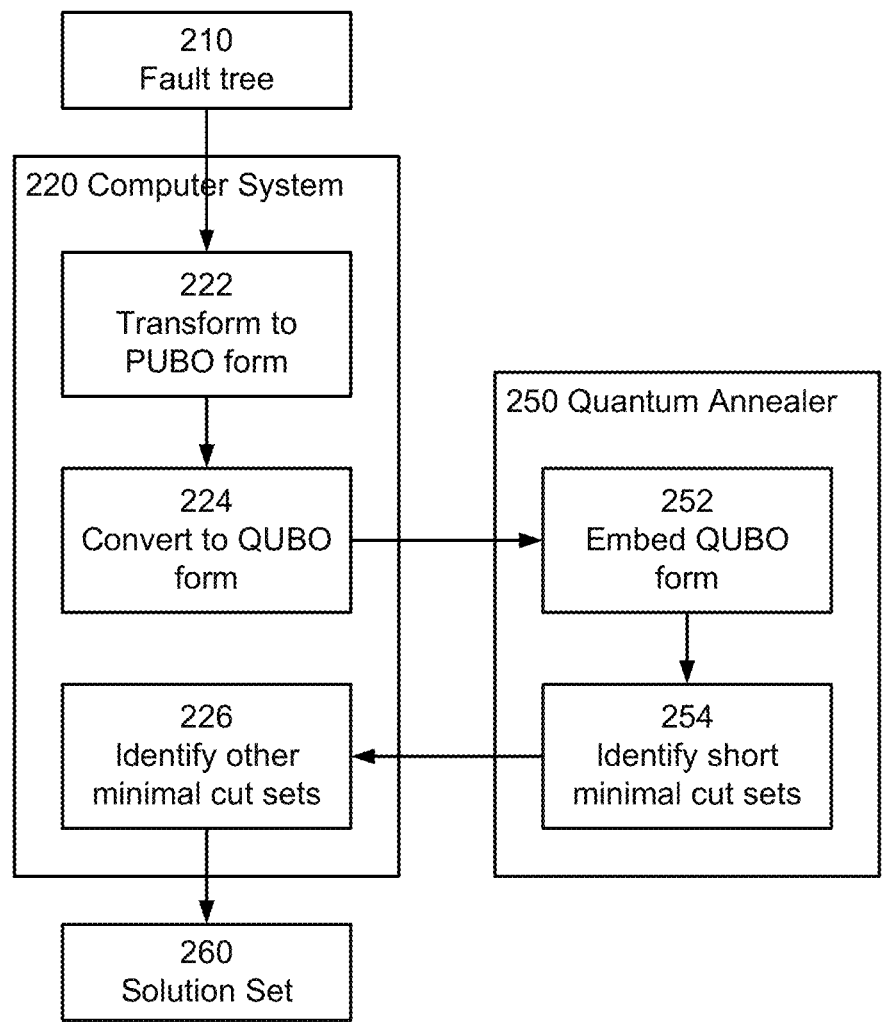
FIG. 2 is a flow chart diagram for fault tree analysis using a quantum processing device.

A common type of fault tree analysis is to determine an exhaustive list of minimal cut sets for the fault tree, or an exhaustive list of minimal cut sets that are below a threshold cardinality. FIG. 2 is a flow chart diagram for this type of fault tree analysis using a combination of quantum processing devices 250 and digital computer systems 220. In this example, quantum annealing is used, although other quantum approaches may also be used. Quantum annealing is a metaheuristic algorithm that leverages quantum effects such as quantum tunneling and interference. Quantum annealers are special-purpose quantum processing devices that run the quantum annealing metaheuristic. The quantum annealing metaheuristic can efficiently find minimal cut sets with low cardinality for a fault tree. As a result, the quantum annealing metaheuristic may be used to perform a preliminary search that identifies some of the shorter minimal cut sets of a given fault tree. An exhaustive, classical algorithm is then run on a digital computer system to determine the remaining minimal cut sets. The classical algorithm may be constrained by the lower bound on cardinality provided by the minimal cut sets found by the quantum annealing metaheuristic, thus accelerating the search.

In FIG. 2, the fault tree of interest 210 is loaded onto a digital computer system 220. The digital computer system 220 configures and runs a quantum processing device 250 to analyze the fault tree for minimal cut sets. In this example, the quantum processing device is a quantum annealer, which solves problems that correspond to the quadratic unconstrained binary optimization (QUBO) mathematical formulation shown below $$G = -\sum_m h_m s_m - \sum_{m<n} J_{mn} s_m s_n \qquad (1)$$

where G is the objective function, $h_m$ are the flux biases on each qubit $s_m$, and $J_{m,n}$ are the couplings between qubits $s_m$ and $s_n$.

In order to obtain this QUBO formulation, the digital computer system 220 first transforms 222 the fault tree into the pseudo-Boolean PUBO formulation, given by:

$$H_{PUBO}(e_i, z_j, p_0) = H_{consist}(e_i, z_j, p_0) + H_{numfaults}(e_i, z_j, p_0) \qquad (2)$$

where $H_{consist} = \sum_j H_{gates}^{(j)}$ $H_{gates}^{(j)}(\{x_j\}, z_j, e_i) = \lambda_{consist}^{(j)} XOR(G_j(x_j), z_j)$ $H_{numfaults}(e_i) = \sum e_i$ Here, $e_i, z_j, p_0 \in \{0,1\}$ are binary variable vectors representing the primary events, intermediate events (outputs of the gates) and the top event, respectively, and $H_{PUBO}$ is the objective function. The primary events $e_i$, intermediate events $z_j$ and top event $p_0$ are represented by qubits in the PUBO notation. Note that this PUBO formulation is not the only possible formulation but is mentioned explicitly only for the sake of concrete illustration purposes.

The first term of the PUBO formulation, $H_{consist}$, is the summation of $H_{gates}^{(j)}$ where (j) is an index for the gates so the summation is over all gates. $H_{gates}^{(j)}$ s is an objective function that represents the logical consistency of each gate (j). $\lambda_{consist}^{(j)}$ is a penalty factor that is either applied if the XOR( )=1 or not applied if the XOR( )=0. The two operands for the XOR are the logical output of gate (j) given the set of inputs $\{x_j\}$ for that gate, and the actual output $z_j$ of gate (j). Thus, the penalty is applied if these two quantities are different (i.e., the solution being considered is inconsistent with the fault tree logic) and is not applied if the solution is consistent with the fault tree logic. Because we are looking for cut sets, the top output $p_0$ is set to occur, which in this example is $p_0=1$. The second term of the PUBO formulation, $H_{numfaults}$, is the summation of the primary event variables. This is just the number of primary events that have occurred. Thus, the second term favors solutions with fewer primary events (i.e., shorter cut sets).

The PUBO notation is converted 224 to quadratic unconstrained binary optimization (QUBO) form by the addition of an energy penalty term $E_{penalty}$ resulting from the addition of ancillary variables to meet the quadratic constraint, yielding:

$$H_{QUBO} = H_{consist} + H_{numfaults} + E_{penalty} \qquad (3)$$

where $E_{penalty} = \delta(3q_{ap} + q_k q_l - 2q_k q_{ap} - 2q_l q_{ap})$

Here, $\delta$ is the penalty factor, $q_k$ and $q_l$ are qubits based on the events $e_i$ and $z_j$, and $q_{ap}$ are the ancillary qubits. In the notation $q_{ap}$, $q_a$ indicates these are ancillary qubits and p is the index. The formulation of Eqn. (3) is equivalent to the form given in Eqn. (1). In converting to QUBO form, functions with higher than quadratic terms are reduced to quadratic form. Ancillary variables of the form $q_{ap} = q_k q_l$ are used to do this. When making this substitution in the PUBO expression, since the ancillary variables are new variables whose values are independent of the original variables, we also penalize the incorrect variable assignments. This is done by adding a penalty term for each ancillary variable of the form $E_{penalty}$ where $\delta$ is the chosen penalty.

This is used to embed 252 the problem onto the quantum annealer 250. The information from the digital computer 220 is sent to the quantum annealer 250 using standard network protocols. The quantum annealer could be located in the same physical facility as the digital computer, or it could be at a remote location connected by the Internet or other network. When the QUBO form is embedded into the hardware graph of the quantum annealer, the goal of the annealing process is to find solutions that minimize the objective function given by Eqn. (3). In doing so, the quantum annealing computer 250 solves 254 for the shortest minimal cut sets. The resulting solutions provide information about the lowest cardinality of the minimal cut sets. For example, the quantum annealing computer 250 may find at least one of the minimal cut sets with lowest cardinality, or all of the minimal cut set with lowest cardinality, or even all of the minimal cut sets below a certain cardinality.

This information may be used as a parameter for a classical search algorithm to be run on the digital computer system 220, solving 226 for the remaining minimal cut sets. The digital computer system 220 identifies additional minimal cut sets, but using information from the minimal cut sets identified by the quantum processing device. For example, if the results from the quantum processing are sufficient to determine the lowest cardinality of the minimal cut sets, then the digital computer system 220 may identify additional minimal cut sets, subject to a constraint that cardinality of the additional minimal cut sets is not less than the lowest cardinality. This can speed up the search by the digital computer system 220.

The result 260 of the hybrid quantum/digital method is a complete set of minimal cut sets for the fault tree. Using the quantum annealer 250 speeds up the overall process, compared to if the digital computer system alone were used to identify all of the minimal cut sets.

The approaches described above are amenable to a cloud quantum computing system, where quantum computing is provided as a shared service to separate users. One example is described in patent application Ser. No. 15/446,973, "Quantum Computing as a Service," which is incorporated herein by reference.

Figure 3:
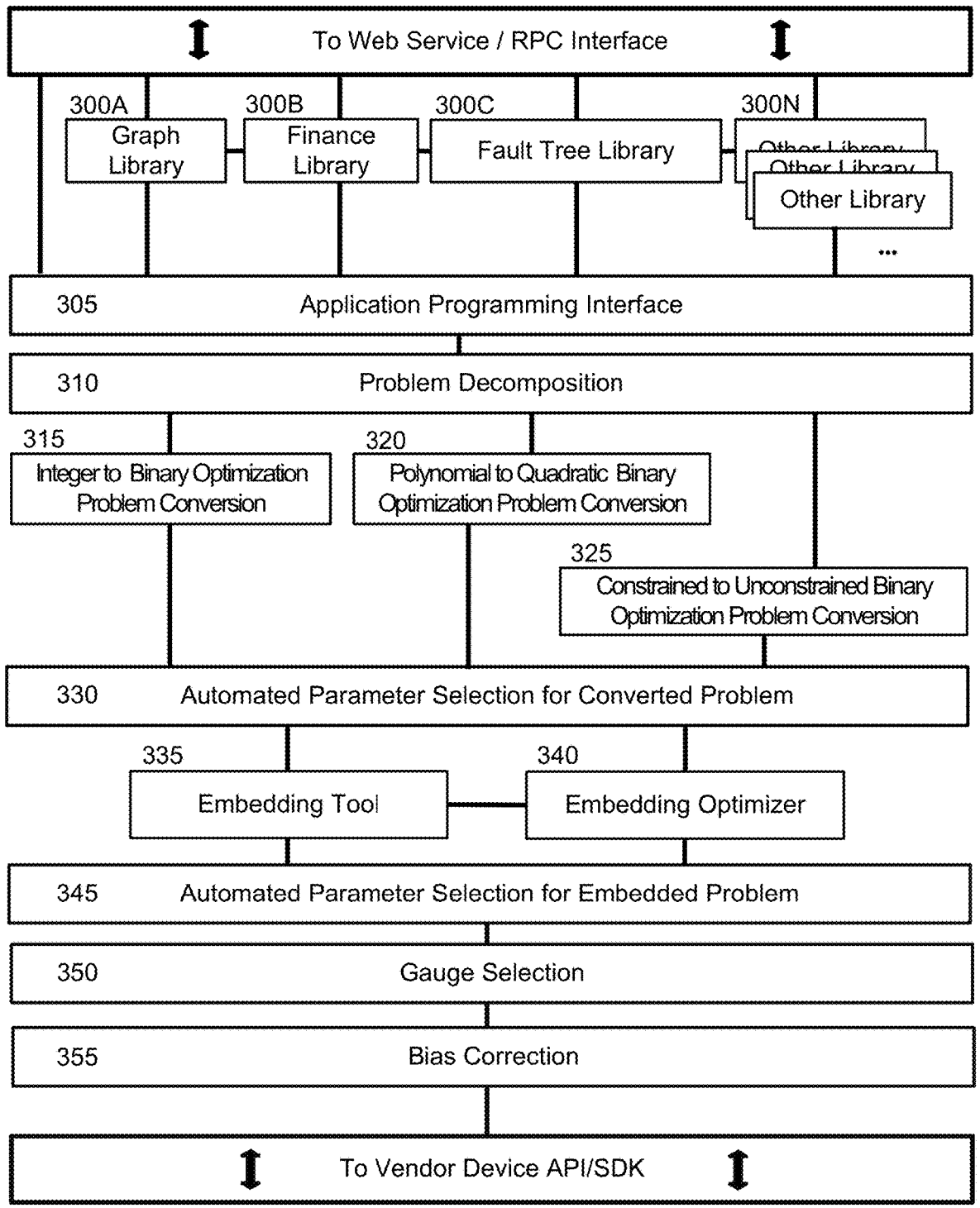
FIG. 3 is a logical diagram of a backend server suitable for use in providing quantum computing as a service (QCaaS).

FIG. 3 is a logical diagram of a backend server suitable for use in providing quantum computing as a service (QCaaS). Data flows into and out of the server via the interfaces at the top and bottom of the diagram. The web service/RPC interface at the top of FIG. 3 is user-facing. The vendor device API/SDK at the bottom connects to the hardware quantum processing device(s).

The backend server may contain one or more domain-specific libraries 300 that may be useful for developing software for or solving problems on quantum processing devices. Each domain-specific library may include software routines, data models, and other such resources as may typically appear in a software library. FIG. 3 specifically shows graph analytics 300A, finance 300B, and a fault tree 300C as domains where domain-specific libraries and routines may be especially useful, but library 300N emphasizes that any domain-specific library may be incorporated at this layer of the backend server. The numbering 300A-N emphasizes the extensible nature of the backend server. Based upon the components lower down in the diagram, any number of domain-specific libraries 300 may be written and integrated into the backend server. The functions 222, 224, 226 shown in FIG. 2 may be implemented as part of the fault tree library 300C.

The API 305 exposes the functions, data structures, models, and other core interfaces of the backend server. The API 305 may connect with one or more libraries 300A-N and/or may directly communicate with the web service/RPC interface, depending on the information being supplied to the backend server. The API 305 is responsible for examining a problem and whatever information is supplied to the backend server and determining how to execute the problem on quantum processing devices and/or classical solver libraries, with the help of the remaining modules shown in FIG. 3.

One such module is problem decomposition module 310. The processes conducted by this module involve taking a large problem and splitting it into smaller subproblems, whose solutions may be combined to obtain an exact or approximate solution to the entire problem. For example, if one is solving the Traveling Salesman Problem (TSP) for a large number of cities, there are heuristics in the literature for how to decompose the problem into multiple smaller TSP subproblems over smaller numbers of cities, and to then recombine the solutions of those subproblems into an approximate solution for the overall TSP problem.

The modules, 315, 320, and 325, relate to taking a discrete optimization problem of one form and converting it into a quadratic binary unconstrained form. Module 315 uses heuristics to convert an integer optimization problem into a binary optimization problem. Module 320 uses heuristics to convert a higher-order polynomial binary optimization problem into a quadratic binary optimization problem. Module 325 uses heuristics involving penalty terms to convert a constrained binary optimization problem into an unconstrained binary optimization problem. Depending on the input provided to the backend server, none, one, some, or all of these modules 315, 320, 325 may be used in order to prepare the problem for solution on the quantum processing devices and/or other solver libraries underlying the platform.

Module 330 provides optimizations for the processed problem in order to improve the quality of the solution obtained via the platform.

When the problem is in an optimized state, embedding tools 335, 340 may be run to fit the problem onto a model of the particular hardware architecture of a target quantum processing device. For instance, if a problem is to be solved using a D-Wave quantum processing device, these tools will map the problem onto the chimera graph architecture of that device. The embedding tool 335 may be vendor-supplied or a third-party library, whereas tool 340 can take the output of another embedding tool 335 and provide additional optimizations to make the embedding as compact as possible.

Tool 340 may operate by running the embedding tool 335 multiple times, and choosing the best result to use as the embedding (such may be the mode of operation when tool 335 produces different outputs for different executions). The "best" output of tool 335 may be the embedding with the fewest number of qubits used, the embedding with the shortest chain lengths, or some other criteria that may be specified. Other techniques may be incorporated into the platform for selecting and optimizing embeddings.

The embedded problem (output of tools 335 and/or 340) is then optimized for execution on a specific device via modules 345, 350, 355. At the very end of the process, the optimized problem is dispatched to one or more vendor device APIs/SDKs. At a later point in time, solutions are returned and are passed back to the end user.

Although the detailed description contains many specifics, these should not be construed as limiting the scope of the invention but merely as illustrating different examples. It should be appreciated that the scope of the disclosure includes other embodiments not discussed in detail above. For example, the digital computer system and quantum processing device may have a master-worker architecture, where the digital computer system functions as a master machine and the quantum processing device functions as a worker machine controlled by the master machine.

Alternate embodiments are implemented in computer hardware, firmware, software, and/or combinations thereof. Implementations can be implemented in a computer program product tangibly embodied in a computer-readable storage device for execution by a programmable processor; and method steps can be performed by a programmable processor executing a program of instructions to perform functions by operating on input data and generating output. Embodiments can be implemented advantageously in one or more computer programs that are executable on a programmable computer system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits), FPGAs and other forms of hardware.

What is claimed is:

1. A method implemented on a digital computer system comprising a processor, the processor executing instructions to effect a method for fault tree analysis, the method comprising:
   receiving a description of a fault tree;
   converting the fault tree to a polynomial unconstrained binary optimization (PUBO) form, the PUBO form including binary variables that represent primary events, intermediate events, and a top event associated with the fault tree;
   converting the fault tree from the PUBO form to a quadratic unconstrained binary optimization (QUBO) form;
   sending the fault tree in the QUBO form to a quantum annealing device;
   embedding the fault tree in the QUBO form onto the quantum annealing device;
   determining, by the quantum annealing device, a minimal cut set of the fault tree; and
   based on the minimal cut set determined by the quantum annealing device, running the digital computer system to identify additional minimal cut sets.

2. The computer-implemented method of claim 1 wherein the minimal cut set determined by the quantum annealing device includes at least one of the minimal cut sets with lowest cardinality.

3. The computer-implemented method of claim 1 wherein the quantum annealing device determines a plurality of minimal cut sets of the fault tree, and the plurality of minimal cut sets determined by the quantum annealing device include all of the minimal cut sets with lowest cardinality.

4. The computer-implemented method of claim 1 wherein running the digital computer system to identify additional minimal cut sets comprises:
   determining a lowest cardinality of the minimal cut set determined by the quantum annealing device; and
   running the digital computer system to identify additional minimal cut sets, subject to a constraint that cardinality of the additional minimal cut sets is not less than the lowest cardinality.

5. The computer-implemented method of claim 1 wherein the quantum annealing device and digital computer system together identify all of the minimal cut sets for the fault tree.

6. The computer-implemented method of claim 1 wherein the quantum annealing device and digital computer system together identify all of the minimal cut sets below a threshold cardinality for the fault tree.

7. The computer-implemented method of claim 1 wherein the method identifies the minimal cut sets in less time than if the digital computer system alone were used to identify all of the minimal cut sets.

8. The computer-implemented method of claim 1 wherein the fault tree comprises a top event, primary events, and a network of gates relating the primary events to the top event; an output of each gate generates an intermediate event; and the top event, primary events and intermediate events are represented by qubits on the quantum annealing device.

9. The computer-implemented method of claim 1 wherein the QUBO form includes an energy penalty term.

10. The computer-implemented method of claim 9 wherein the energy penalty term includes ancillary qubits.

11. The computer-implemented method of claim 1 wherein
   the QUBO form includes ancillary qubits that make the QUBO form quadratic.

12. A computing system for fault tree analysis, comprising:
   a digital computer system; and
   a quantum annealing device, wherein:
      the digital computer system receives a description of a fault tree;
      the digital computer system converts the fault tree to a polynomial unconstrained binary optimization (PUBO) form, the PUBO form including binary variables that represent primary events, intermediate events, and a top event associated with the fault tree;
      the digital computer system converts the fault tree from the PUBO form to a quadratic unconstrained binary optimization (QUBO) form;
      the digital computer system sends the fault tree in the QUBO form to a quantum annealing device;
      the quantum annealing device embeds the fault tree in the QUBO form into a hardware graph of the quantum annealing device;
      the quantum annealing device determines a minimal cut set of the fault tree; and
      based on the minimal cut set determined by the quantum annealing device, the digital computer system identifies additional minimal cut sets.

13. The computing system of claim 12 wherein the digital computer system functions as a master machine and the quantum annealing device functions as a worker machine controlled by the master machine.

14. The computing system of claim 12 wherein the quantum annealing device is available as a shared service to the digital computer system and to other digital computer systems.

15. The computing system of claim 12 wherein the quantum annealing device is located remotely from the digital computer system.

16. A non-transitory computer-readable storage medium storing executable computer program instructions for fault tree analysis, the instructions executable by a processor and causing the processor to perform a method comprising:
   receiving a description of a fault tree;
   converting the fault tree to a polynomial unconstrained binary optimization (PUBO) form, the PUBO form including binary variables that represent primary events, intermediate events, and a top event associated with the fault tree;
   converting the fault tree from the PUBO form to a quadratic unconstrained binary optimization (QUBO) form;
   sending the fault tree in the QUBO form to a quantum annealing device;
   configuring a quantum annealing device to embed the fault tree in the QUBO form into a hardware graph of the quantum annealing device;
   running the quantum annealing device to determine a minimal cut set of the fault tree; and based on the minimal cut set determined by the quantum annealing device, identifying additional minimal cut sets.

17. The non-transitory computer-readable storage medium of claim 16 wherein identifying additional minimal cut sets comprises:

determining a lowest cardinality of the minimal cut set determined by the quantum annealing device; and identifying additional minimal cut sets, subject to a constraint that cardinality of the additional minimal cut sets is not less than the lowest cardinality.

18. The non-transitory computer-readable storage medium of claim 16 wherein the fault tree comprises a top event, primary events, and a network of gates relating the primary events to the top event; an output of each gate generates an intermediate event; and the top event, primary events and intermediate events are represented by qubits on the quantum annealing device.

* * * * *